United States Patent
Levy

(10) Patent No.: US 7,900,009 B2
(45) Date of Patent: Mar. 1, 2011

(54) PRERECORDED DIGITAL PORTABLE PERSONAL STEREO

(75) Inventor: Olivier Levy, Paris (FR)

(73) Assignee: Strapmedia, Paris (FR)

( * ) Notice: Subject to any disclaimer, the term of this patent is extended or adjusted under 35 U.S.C. 154(b) by 261 days.

(21) Appl. No.: 12/216,628

(22) Filed: Jul. 8, 2008

(65) Prior Publication Data

US 2009/0030538 A1 Jan. 29, 2009

Related U.S. Application Data

(63) Continuation-in-part of application No. 11/794,552, filed on Nov. 20, 2007, now abandoned.

(30) Foreign Application Priority Data

Jan. 25, 2006 (FR) .................... 06 00687
Jan. 23, 2007 (WO) ............... PCT/FR2007/000130

(51) Int. Cl.
*G06F 12/00* (2006.01)
(52) U.S. Cl. ......................... 711/163; 700/94
(58) Field of Classification Search .................. None
See application file for complete search history.

(56) References Cited

U.S. PATENT DOCUMENTS

| 5,991,594 | A | 11/1999 | Froeber et al. |
| 6,425,018 | B1 | 7/2002 | Kaganas et al. |
| 2003/0016940 | A1* | 1/2003 | Robbins ...................... 386/46 |
| 2004/0059927 | A1* | 3/2004 | Chen ........................... 713/189 |
| 2005/0184161 | A1* | 8/2005 | Chen et al. .................. 235/486 |
| 2006/0020890 | A1 | 1/2006 | Kroll et al. |
| 2006/0020968 | A1 | 1/2006 | Kroll et al. |
| 2006/0239657 | A1 | 10/2006 | Geva et al. |
| 2007/0298840 | A1 | 12/2007 | Squires |

FOREIGN PATENT DOCUMENTS

| CN | 1349649 | 5/2002 |
| FR | 2 702 582 A1 | 9/1994 |
| GB | 2 414 336 | 11/2005 |
| WO | WO 95/26009 | 9/1995 |
| WO | WO 2006/012572 A2 | 2/2006 |
| WO | WO 2006/012573 A2 | 2/2006 |

OTHER PUBLICATIONS

Findaway: "Findaway Frequently Asked Questions" Findaway [On Line], Jan. 12, 2005 (Jan. 2, 2005), XP002438519, URL: http://www.mitbc.org/playaway.pdf, pp. 7-11.

* cited by examiner

*Primary Examiner*—Hiep T Nguyen
(74) *Attorney, Agent, or Firm*—McKenna Long & Aldridge LLP

(57) ABSTRACT

This digital portable personal stereo comprises a housing containing a connection interface for connection to earphones; a digital memory immovably attached to the housing; an electronic circuit for accessing said memory; and a control interface for controlling said electronic circuit wherein that a encrypted audio content is prerecorded in the digital memory, and in that the portable personal stereo is adapted to prevent any other audio content from being written in the digital memory.

12 Claims, 1 Drawing Sheet

PRERECORDED DIGITAL PORTABLE PERSONAL STEREO

The present application is a continuation in part of U.S. application Ser. No. 11/794,552, filed Jul. 2, 2007 corresponding to the national stage of the international application PCT/FR 2007/000130, and claims priority from U.S. patent application Ser. No. 11/794,552, the French Application FR 0600687 filed on Jan. 25, 2006 and International Application PCT/FR 2007/000130 filed on Jan. 23, 2007, which are all hereby incorporated by reference in its entirety.

The present invention relates to a digital portable stereo, i.e. to a portable digital audio player.

BACKGROUND OF THE INVENTION

In particular because of the development in the performance levels of digital memories and of audio data compression systems, there currently exist a large number of digital portable personal stereos.

In general, such a portable personal stereo includes a high-capacity internal digital memory connected to a communications interface by means of which it is possible to record audio content in the digital memory from external equipment such as a computer.

Such a portable personal stereo also includes an electronic circuit for write and read accessing a memory, and a control interface that can be of various degrees of sophistication. Said interface is used for controlling operation of the portable personal stereo, and in particular for controlling write and read accessing of the digital memory.

That applies, for example, to the digital portable personal stereo described in Patent Document US 2003/0016940.

Because of their complexity and of the need to interconnect them with other equipment, such portable personal stereos require advanced electronic circuits; that poses problems in terms of cost, of consumption, and of sturdiness, in particular when the size of the portable personal stereos is small. Similarly, the communications interfaces are elements that are costly and fragile.

SUMMARY OF THE INVENTION

An object of the invention is to solve those problems by means of a digital portable personal stereo that is simple, robust, and inexpensive.

To this end, the present invention provides a digital portable personal stereo comprising a housing containing:
a connection interface for connection to earphones;
a digital memory;
an electronic circuit for accessing said memory; and
a control interface for controlling said electronic circuit.

It is characterized in that a first audio content is prerecorded in the digital memory, and in that the portable personal stereo is adapted to prevent any other audio content from being written in the digital memory.

Thus, the use of a memory having non-renewable audio content makes the capacity of communicating with a computer or with any equivalent equipment unnecessary. This makes it possible, in particular, to simplify the electronic circuit for accessing the memory and to simplify the control interface, to increase mechanical robustness by omitting the communications interface, and to reduce power consumption.

As a result, the portable personal stereo makes it possible to constitute a single-use portable personal stereo, or indeed a disposable portable personal stereo.

According to other characteristics of the invention:
the digital memory is accessible only via the electronic circuit of the portable personal stereo, said electronic circuit being suitable only for read accessing the digital memory;
the digital memory is accessible only via the electronic circuit of the portable personal stereo, said circuit not having access to any other audio content that might be recorded in the digital memory;
said digital memory is a memory of the write-once type;
the portable personal stereo further comprises inhibit means for inhibiting operation as a function of conditions of use;
the inhibit means are adapted to inhibit operation of the electronic circuit for accessing the digital memory;
the inhibit means are adapted to inhibit operation of the digital memory;
the inhibit means comprise a non-rechargeable battery that is mounted to be an integral part of the housing and that powers the portable personal stereo electrically;
the portable personal stereo is further provided with remote control means for remotely controlling the inhibit means; and
the electronic circuit and the digital memory are formed in a single electronic component.

According to another embodiment of the invention, the portable personal stereo comprises a smart card adapted to perform functions such as virtual purse, access control or localization. Advantageously, the electronic circuit interacts with the smart card audio signals are generated in accordance to the status and actions of the smart card.

BRIEF DESCRIPTION OF THE DRAWINGS

The present invention can be better understood on reading the following description given by way of example and with reference to the accompanying figures, in which.

DESCRIPTION OF PREFERRED EMBODIMENTS

Figure 1:
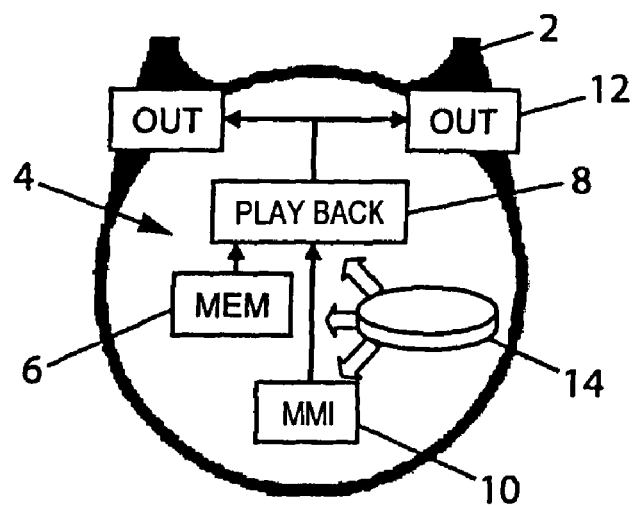
FIG. 1 is a block diagram showing the internal circuits of a portable personal stereo of the invention.

As shown in FIG. 1, the portable personal stereo mainly comprises a housing 2 that is generally disc shaped, and that defines front and rear faces and a cavity 4 in which electronic elements are placed.

In the cavity 4, the portable personal stereo includes an audio-content digital memory MEM 6. For example, this memory is a flash memory containing music files that are encoded in compliance with the "mp3" standard or any other standard audio compression format.

The memory 6 is prerecorded, i.e. an audio content is prerecorded during a stage prior to use, such as a manufacturing stage.

The memory 6 is accessible via an electronic circuit 8 controlled by a control interface MMI 10 in order to deliver an audio signal corresponding to the content of the memory 6 to two output ports OUT 12.

All of the elements of the portable personal stereo are powered by an electrical power source such as a non-rechargeable battery 14, also placed in the cavity 4.

Figure 2:
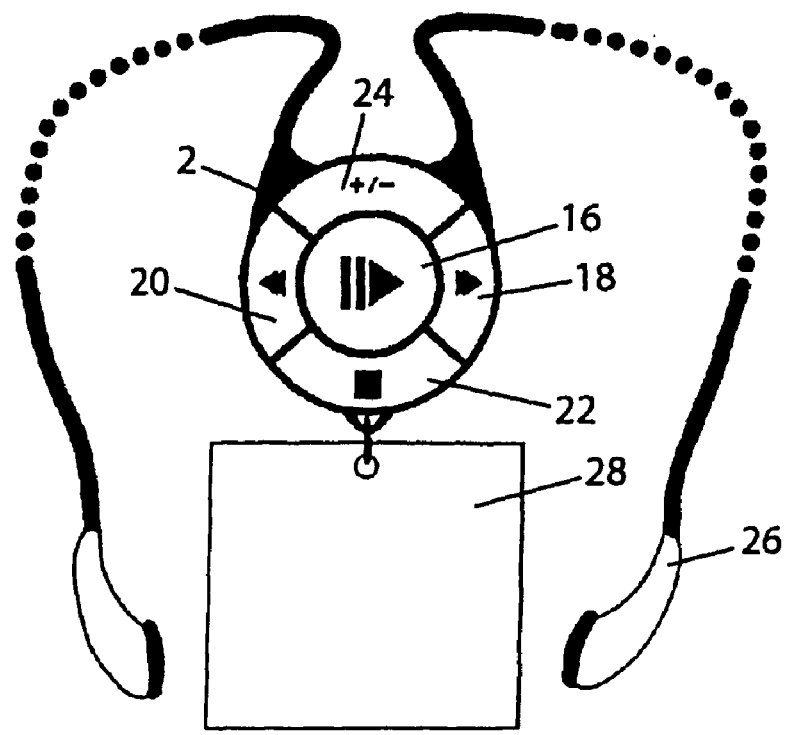
FIG. 2 is an external view of the portable personal stereo of FIG. 1.

The control interface 10 is connected to four buttons distributed around the periphery of the housing 2 and to a central fifth button, as shown in FIG. 2. The functions of these buttons are known per se. For example, the central button 16 causes the audio content to be played continuously or causes such play to be paused, the buttons 18 and 20 respectively cause the audio content to skip forwards or backwards, the button 22 causes play to stop completely, or indeed causes the portable personal stereo to be switched off, and the button 24 makes it possible to adjust the sound volume of the audio signal delivered to the output ports 12.

The portable personal stereo further comprises a pair of earphones 26 connected to the ports 12. In the embodiment described, said earphones 26 are secured to the housing 2 so that the portable personal stereo can be used directly without requiring a preparatory operation such as plugging in the earphones.

Finally, in the example, the portable personal stereo is provided with a tag 28 attached to the housing 2 and bearing information describing the audio content of the memory 6. In a variant, the tag 28 bears advertising information.

The portable personal stereo of the invention is adapted to prevent any other audio content from being written in the digital memory 6, i.e. to prevent the prerecorded audio content from being renewed.

In a first embodiment, the memory 6 is accessible only via the electronic circuit 8 which is adapted only to read the content of the memory 6. Thus, the audio content of the memory 6 cannot be modified.

In a variant, the memory 6 is accessible only via the electronic circuit 8 which does not have any replacement audio content. Thus, even if the electronic circuit is adapted to write access the memory, no renewal of the audio content can be performed.

In these embodiments, the portable personal stereo does not have a communications interface making it possible to access the memory 6 from any other equipment for writing in the memory, and in particular equipment such as a computer. Thus, neither the electronic circuit 8 of the portable personal stereo nor any external equipment can write new audio content in the memory.

In addition, the absence of any communications interface makes it impossible to duplicate the content of the memory 6. Advantageously, the content of the memory is encrypted by means of an encryption key lodged in a tamperproof memory of the portable personal stereo in order to prevent any duplication of the content even when the portable personal stereo is disassembled.

In another variant, the memory 6 is a write-once memory, such as a Read-Only Memory (ROM). Therefore, independently of the capacities of the electronic circuit 8 and of the existence of a communications interface, the content of said memory cannot be modified.

Since the audio content of the digital memory cannot be renewed, the portable personal stereo is simple and easy to use. In addition, the use of an electronic circuit that is limited to reading, the absence of any communications interface, or indeed the use of a non-rewritable memory reduces the cost of the portable personal stereo, and increases its electronic and mechanical simplicity and its sturdiness.

In addition, in another embodiment of the invention, the portable personal stereo is further provided with means for inhibiting operation as a function of conditions of use such as the number of times it is used, the frequency of use, the time for which it is used, or some other conditions.

In a first embodiment, the portable personal stereo is adapted so as to allow only a determined number of reads of the content of the memory. For example, once a maximum number of read accesses is reached, the access electronic circuit is inhibited and the content of the memory can no longer be read.

By way of a variant, when the maximum number of read accesses is reached, the digital memory is re-initialized. Optionally, the initialization comprises a write access to the digital memory. Such a write access does not constitute write access for writing a new audio content. The prerecorded audio content is overwritten with blank data and not by another audio content.

In another embodiment, the battery of the portable personal stereo is a non-rechargeable battery that is mounted to be an integral part of the housing 2 so that it cannot be replaced. Therefore, once the battery is discharged, it is no longer possible to use the portable personal stereo. It is thus possible to limit the time for which the portable personal stereo is used by determining the quantity of energy stored in the battery, and the consumption of the portable personal stereo.

Advantageously, the inhibit means include a remote control unit, e.g. operating by electromagnetic waves such as magnetic waves from a security gate. Thus, the portable personal stereo can be inhibited on passing through such a gate, so that it operates only within a defined area.

Other embodiments can also be devised.

In particular, in yet another variant, the memory and the read electronic circuit are formed in the same component. This embodiment is particularly advantageous for reducing the cost and the overall size of the portable personal stereo.

In another embodiment the portable personal stereo also comprises a smart card. This smart card is connected to the electronic circuit 8 or is directly integrated in the electronic circuit 8.

In a first application, this smart card is used as a contactless virtual purse. For example, the virtual purse is pre-charged with a determined amount of money and used in a classical manner.

In another application, the smart card is used to pay public transportation such a bus or subways, the virtual purse being adapted to communicate with certain public transportation access portals.

Advantageously, the smart card is programmed to interact with the electronic circuit and to deliver information related to the amount of money left by way of the audio interface of the portable personal stereo.

In another application, the smart card is used to allow access to one or several predetermined facilities. For example, the smart card is programmed to allow a one time access to a specific museum.

In one embodiment, the smart card comprises control access means. For example, the smart card comprises an identification number readable by an access portal located at the entrance of the facility. The access portal and the smart card can interact by use of radiofrequency access control means such as a RFID chip JAVA Card or the like.

In one embodiment, the smart card is used as virtual purse preloaded with an amount of money corresponding to the entrance fee and can only be used at a specific access portal.

Advantageously, when the smart card is used to allow access to a facility, it interacts with the electronic circuit to deliver audio information related to the facility. For example, upon entering a museum, the portable personal stereo automatically detects the entrance access portal, pays the entrance fee and starts delivering audio content related to the visited museum.

In yet another embodiment, the smart card interacts with localization means. For example, the smart card is connected to an RFID chip and interacts with localization portals. For example, such localization portals are spread in a city. In such an embodiment, the smart card interacts with the electronic circuit to automatically play audio contents related to the current location.

In one embodiment, the smart card is connected to the inhibition means to allow access to some audio content only when some criterions are fulfilled. For example, the audio content can be played only when the portable personal stereo is located in a determined area by use of a RFID or similar means.

Naturally, the various embodiments described can be taken separately or in combination.

As a result of the above-described characteristics, the portable personal stereo of the invention is equipment that is simple to manufacture and to use, that is compact, and that is stout. Thus, this portable personal stereo is particularly adapted for single use or for use for advertising purposes.

The invention claimed is:

1. A digital portable personal stereo comprising a housing containing:
   a connection interface for connection to earphones;
   a digital memory immovably attached to the housing;
   an electronic circuit for accessing said memory;
   a control interface for controlling said electronic circuit;
   a remotely controllable inhibitor for inhibiting operation as a function of conditions of use; and
   wherein an audio content is prerecorded in the digital memory, and the portable personal stereo is adapted to prevent any other audio content from being written in the digital memory.

2. A portable personal stereo according to claim 1, wherein the digital memory is accessible only via the electronic circuit of the portable personal stereo, said electronic circuit being suitable only for read accessing the digital memory.

3. A portable personal stereo according to claim 1, wherein the digital memory is accessible only via the electronic circuit of the portable personal stereo, said circuit not having access to any other audio content that might be recorded in the digital memory.

4. A portable personal stereo according to claim 1, wherein said digital memory is a memory of the write-once type.

5. A portable personal stereo according to claim 1, wherein the inhibitor is adapted to inhibit operation of the electronic circuit for accessing the digital memory.

6. A portable personal stereo according to claim 1, wherein the inhibitor is adapted to inhibit operation of the digital memory.

7. A portable personal stereo according to claim 1, wherein the inhibitor comprises a non-rechargeable battery that is mounted to be an integral part of the housing and that powers the portable personal stereo electrically.

8. A portable personal stereo according to claim 1, wherein the electronic circuit and the digital memory are formed in a single electronic component.

9. A portable personal stereo according to claim 1, wherein the audio content is encrypted.

10. A digital portable personal stereo comprising a housing containing:
    a connection interface for connection to earphones;
    a digital memory immovably attached to the housing;
    an electronic circuit for accessing said memory; and
    a control interface for controlling said electronic circuit;
    wherein an audio content is prerecorded in the digital memory, the portable personal stereo is adapted to prevent any other audio content from being written in the digital memory, and the electronic circuit is connected with a smart card formed inside the housing, said smart card being adapted to be used as a virtual purse containing a predetermined amount of money, and wherein said smart card interacts with the electronic circuit to deliver audio content related to the amount of money available in the virtual purse.

11. A digital portable personal stereo comprising a housing containing: a connection interface for connection to earphones;
    a digital memory immovably attached to the housing;
    an electronic circuit for accessing said memory; and
    a control interface for controlling said electronic circuit;
    wherein an audio content is prerecorded in the digital memory, the portable personal stereo is adapted to prevent any other audio content from being written in the digital memory, and the electronic circuit is connected with a smart card formed inside the housing, said smart card being adapted to be used as a device for access control to allow-access to predetermined facilities, and wherein said smart card interacts with the electronic circuit to deliver audio content related to said predetermined facilities upon access.

12. A digital portable personal stereo comprising a housing containing:
    a connection interface for connection to earphones;
    a digital memory immovably attached to the housing;
    an electronic circuit for accessing said memory; and
    a control interface for controlling said electronic circuit;
    wherein an audio content is prerecorded in the digital memory, the portable personal stereo is adapted to prevent any other audio content from being written in the digital memory, and the electronic circuit is connected with a smart card formed inside the housing, said smart card being adapted to interact with localization means, and wherein the smart card interacts with the electronic circuit to deliver audio content related to the current location.

* * * * *